(12) United States Patent
Chai et al.

(10) Patent No.: US 6,583,501 B2
(45) Date of Patent: *Jun. 24, 2003

(54) LEAD FRAME FOR AN INTEGRATED CIRCUIT CHIP (INTEGRATED CIRCUIT PERIPHERAL SUPPORT)

(75) Inventors: Tai Chong Chai, Singapore (SG); Thiam Beng Lim, Singapore (SG); Yong Chua Teo, Singapore (SG); James Tan, Singapore (SG); Ray Camenforte, Singapore (SG); Eric Neo, Singapore (SG); Daniel Yap, Singapore (SG)

(73) Assignee: Institute of Microelectronics, Singapore (SG)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/499,021

(22) Filed: Feb. 7, 2000

(65) Prior Publication Data

US 2002/0163078 A1 Nov. 7, 2002

(30) Foreign Application Priority Data

Feb. 9, 1999 (SG) .............................. 9900054

(51) Int. Cl.⁷ ............................................. H01L 23/495
(52) U.S. Cl. ...................... 257/676; 257/666
(58) Field of Search ................ 257/666, 676, 257/783, 787

(56) References Cited

U.S. PATENT DOCUMENTS 4,924,291 A    5/1990  Lesk et al.
5,429,992 A    7/1995  Abbott et al.
5,479,050 A  * 12/1995  Pritchard et al.
5,661,338 A  *  8/1997  Yoo et al.
5,714,792 A    2/1998  Przano (List continued on next page.)

FOREIGN PATENT DOCUMENTS

EP   0 623 953       11/1994
JP   4-22162       * 1/1992
JP   4-2252-56     * 9/1992
JP   6-236959      * 8/1994

OTHER PUBLICATIONS

Umehara, Norito et al., S–Pad Implementation; Total Plastic Package Crack Solution for Non–Moisture Sensitive Pakcage, New Package Development, Texas Instruments Japan, Ltd., Hi j. i. Plant, 4260 takao, Kawasaki, Hiji–machi, Hayami–gun Oita Japan 879–15.

Ganesan, Gans S. et al., Level I CrackFree Plastic Packaging Technology, Motorola Inc.. Semiconductor Products Sector, 2100 E. Elliot Road, Tempe, AZ 85284.

Nakazawa, Tsutomu et al., A Novel Structure to Realize Crack–Free Plastic Packages During Reflow Soldering Process–Development of Chip Side Support (CSS) Package, IEEE Transactions on Components Packaging and Manufacturing Technology—Pact C, vol. 19, No. 1, Jan. 1996, pp. 61–69.

Chan, K.C. and Chai, T.C., Type II Popcorn Failure Analysis in Plastic Encapsulated IC Package Using Scanning Acoustic Microscopy and Cross–Sectioning (not yet published).

(List continued on next page.)

Primary Examiner—Sheila V. Clark
(74) Attorney, Agent, or Firm—Dykema Gossett, PLLC

(57) ABSTRACT

A lead-frame for connecting and supporting an integrated circuit chip with a chip accommodating zone with inwardly extending ears for supporting the chip including minimum shoulder area, and having open crack and delamination stopping regions.

25 Claims, 5 Drawing Sheets

U.S. PATENT DOCUMENTS 5,773,878 A * 6/1998 Lim et al.
5,818,103 A * 10/1998 Harada
5,859,387 A * 1/1999 Gagnon
5,874,773 A * 2/1999 Terada et al.
5,886,405 A * 3/1999 Kim et al.
5,903,048 A * 5/1999 Bandou et al.
5,905,301 A * 5/1999 Ichikawa et al.
5,945,688 A * 8/1999 Kassahara et al.
5,990,544 A * 11/1999 Ohishima
6,191,490 B1 * 2/2001 Huang

OTHER PUBLICATIONS

Cha, Ki–Bon et al.; Ultra–Thin and Crack–Free Bottom Leaded Plastic (BLP) Package Design; LG Semicon (Gold Star) Package R&D Center, Cheongju, Korea 360–480 0569–5503/95/0000 ©1995 IEEE.

* cited by examiner

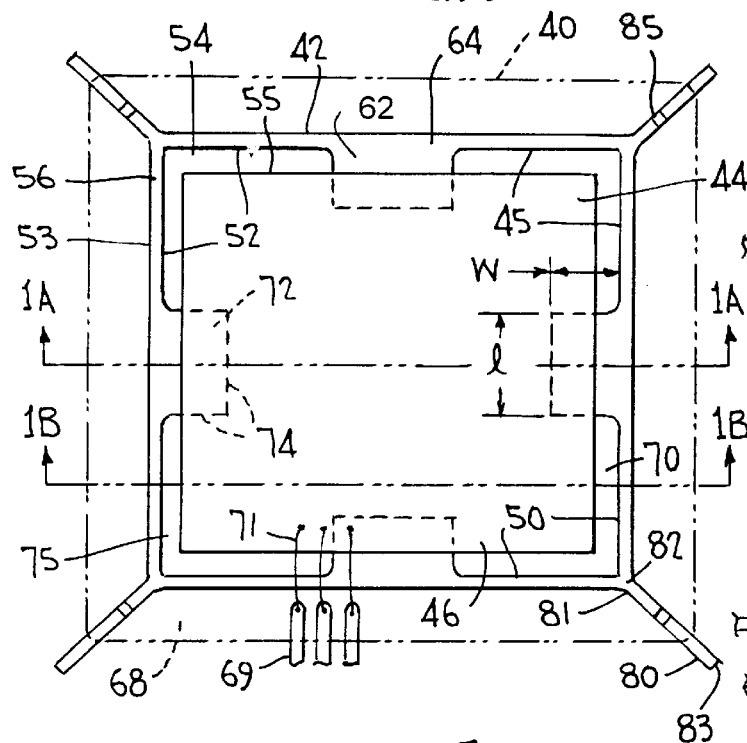
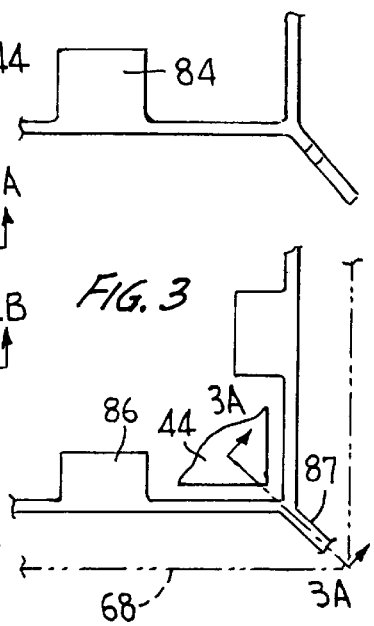
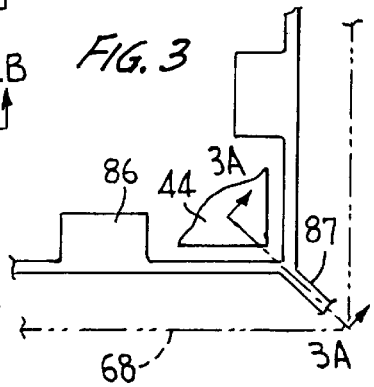
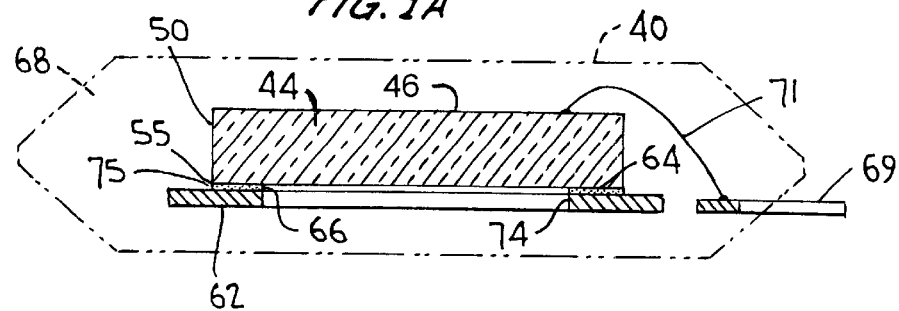
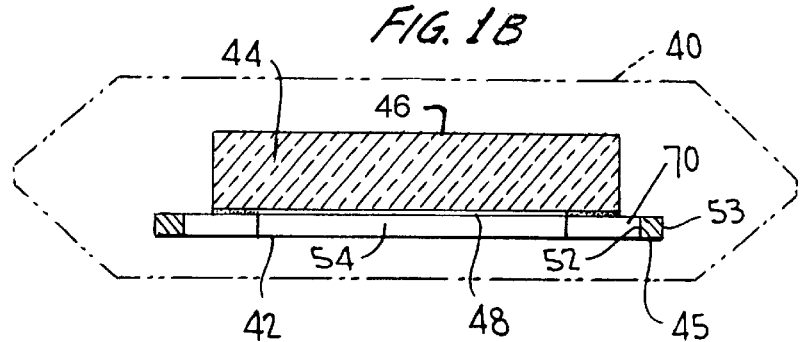

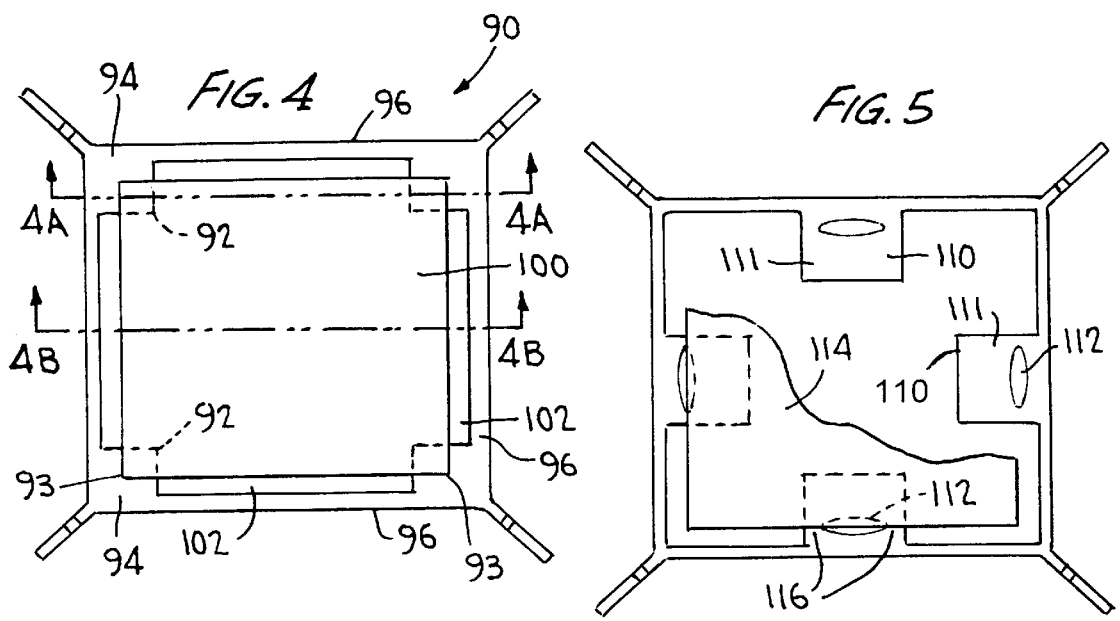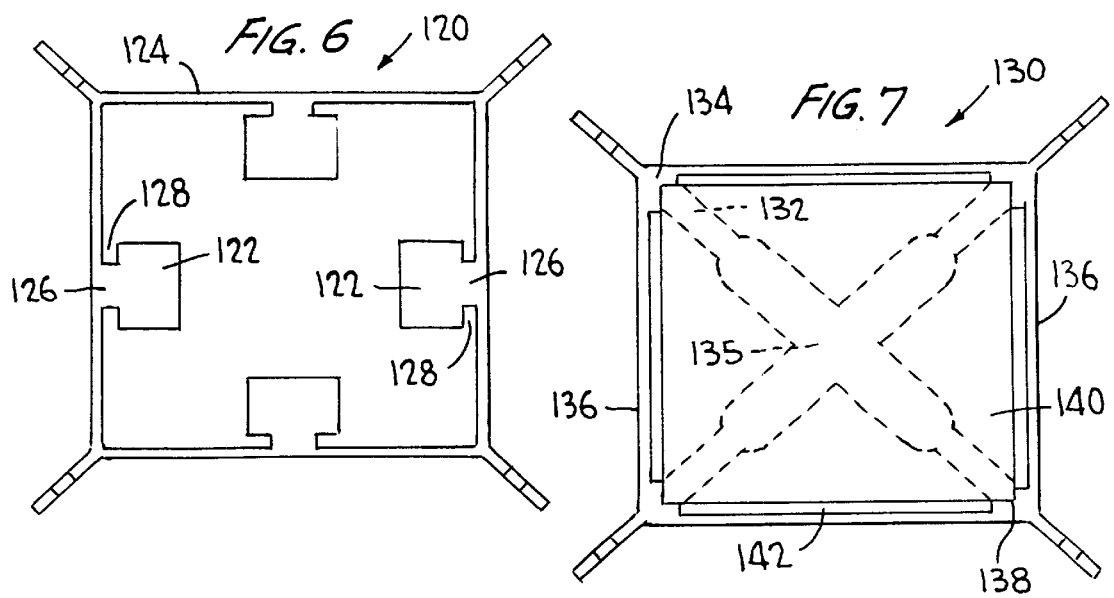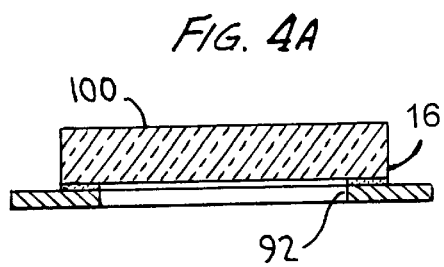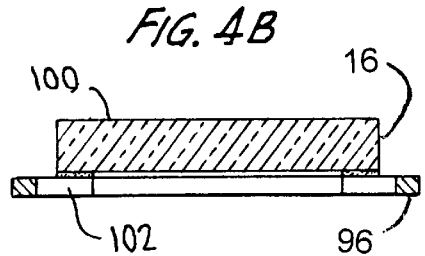

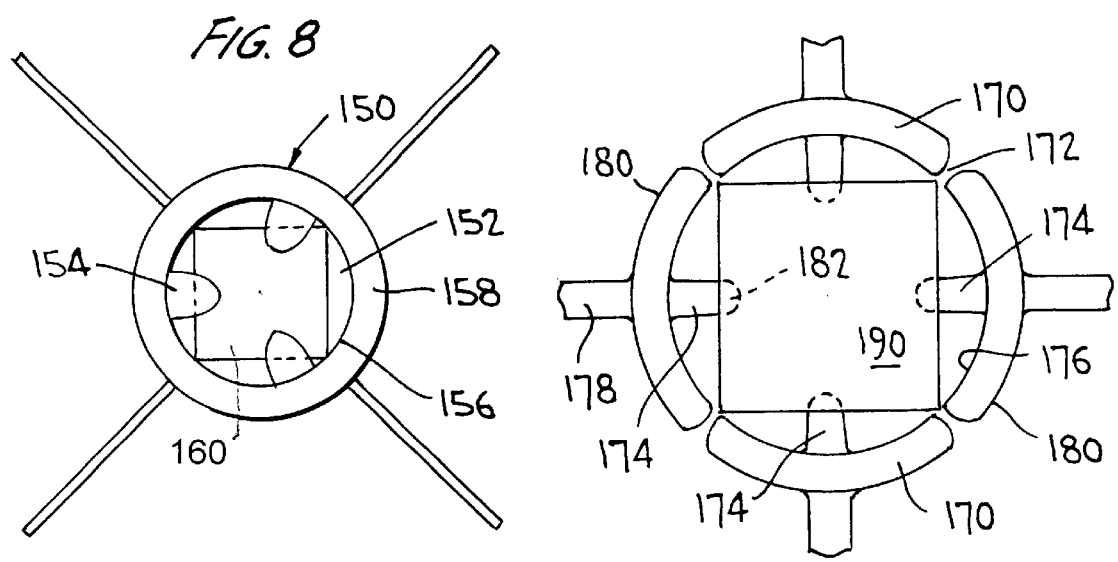
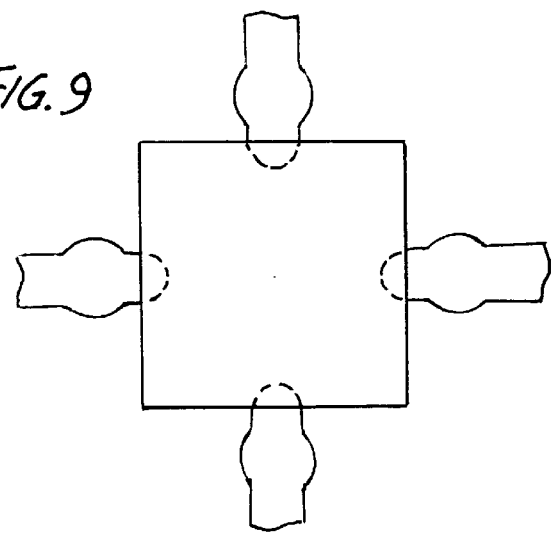
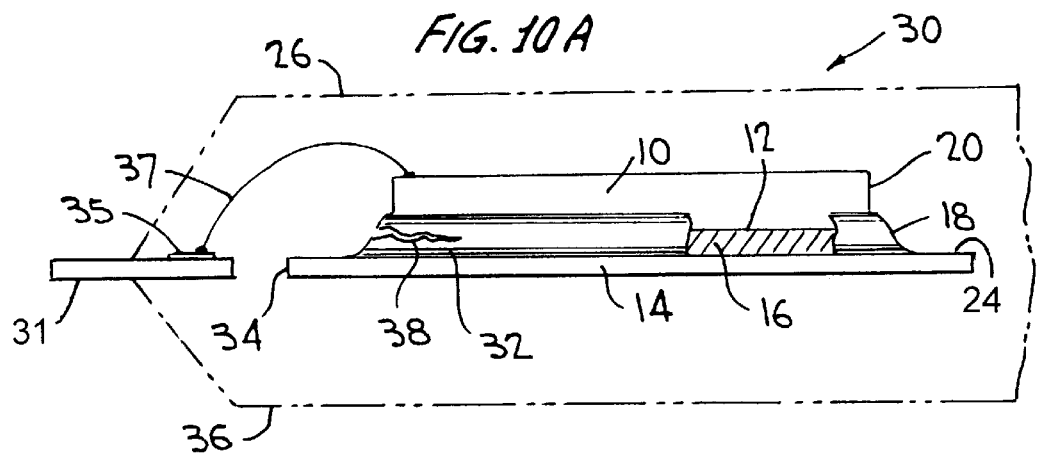

US 6,583,501 B2

LEAD FRAME FOR AN INTEGRATED CIRCUIT CHIP (INTEGRATED CIRCUIT PERIPHERAL SUPPORT)

BACKGROUND OF THE INVENTION

This invention relates to packaging for a semiconductor device, and more particularly to a crack inhibiting lead frame for a semiconductor integrated circuit. Conventional plastic semiconductor packages suffer from a failure mode referred to as "popcorn cracking." This failure mode occurs in packages that are exposed to ambient moisture and are then heated to high temperatures, typically during reflow soldering.

The problem apparently arises because plastic IC packages have a tendency to absorb moisture from the environment. The moisture diffuses into the mold compound and other materials such as the chip attach material. During the solder reflow process, thermal vapor stresses developed at the chip attach material/die-pad interface or the mold compound/die-pad interface cause delamination to occur, especially at areas of high interfacial stress.

A conventional full pad design is shown in FIGS. 10, 10A and 10B where a chip or die 10 has its lower side 12 secured to a chip pad 14 by a chip attach material 16. The chip attach 16 forms a fillet 18 between the side wall 20 of the chip 10 and the upper surface 22 of the chip pad 14 in an outer region known as the shoulder 24. The pad 14 and attached chip 10 are thereafter encapsulated, or molded, in an encapsulation material 26, for example epoxy, forming a package 30 in a known manner. In FIG. 10A, the package 30 is fabricated on a metal leadframe 31. The package 30 includes wire bonds 37.

Delamination of the chip 10 from the chip pad 14 and/or delamination of the die attach 16 from chip pad 14 can occur when the interfacial stresses exceed the interfacial strength. In particular, delamination often starts near the corner 32 of the chip 10 where the chip 10 meets the shoulder 24. In the case of the full pad design shown, delamination can rapidly propagate over the entire pad area. This can cause the package 30 to crack from the outer edge 34 of the chip pad 14 where the cohesive strength of the mold compound 26 is exceeded. The resulting crack may propagate through the encapsulation 26 to the outer surface 36 of the package 30. In a like manner, delamination of the chip pad 14 from the encapsulation material 26 can also act as a crack source resulting in a popcorn failure.

These problems necessitate storage of components in humidity controlled environments prior to reflow soldering. Such required storage procedures represent additional cost and uncertainty in product quality.

SUMMARY OF THE INVENTION

The invention is based upon the discovery that a lead frame for a crack resistant integrated circuit package has an isolated chip periphery support structure, including sidebars with inwardly extending chip contacting ears, and open crack-stop and delamination-stop areas therebetween. In a package utilizing the lead frame, the integrated circuit or chip is attached to the upper surface of the ears, and encapsulation material encloses and surrounds the frame and the chip. The encapsulation material bonds to a majority of the surface area of the chip and hardens to complete the package.

The invention provides a lead frame that reduces the popcorn failure that can occur during a solder reflow process. In an exemplary embodiment, this is achieved by reducing or minimizing the adhesive or attach material shoulder fillet, introducing crack-stop regions that interrupt the propagation of delamination or cracks and increasing the bonding surface area between the chip and encapsulation material.

In particular, the invention has two primary aspects. The first is that limiting the length of delamination failures limits the bending moment applied by water vapor evolved by heating water previously absorbed by the encapsulation material. By limiting bending moment, package flexure and consequent cracking are reduced. The second aspect of the invention reflects the discovery that the highest delamination stresses are concentrated in the shoulder region and at the corners of the chip. By moving the interfaces most vulnerable to delamination away from the chip corners, by minimizing shoulder regions, and by limiting the potential span of any delamination by reducing chip attach areas, the overall potential for popcorn cracking failure is reduced.

BRIEF DESCRIPTION OF THE DRAWINGS

The objects and advantages of the present invention will become apparent by reference to the following description and accompanying drawings wherein:

FIG. 1 is a plan view of an Isolated-Chip-Periphery-Support (ICPS) lead frame according to an exemplary embodiment of the invention;

FIGS. 1A and 1B are respective cross sections of the ICPS lead frame of FIG. 1, taken along lines 1A—1A and 1B—1B, thereof;

FIGS. 2 and 3 are fragmentary plan views of an ICPS design employing ears of various relative dimensions;

FIG. 4 is a plan view of an ICPS design employing a comer ear;

FIGS. 4A and 4B are the respective cross sections of the ICPS lead frame of FIG. 4, taken along lines 4A—4A and 4B—4B, respectively;

FIG. 5 is a plan view of an ICPS employing an ear with an upper surface perforated by a through hole;

FIG. 6 is a plan view of an ICPS design employing an undercut ear or necked ear;

FIG. 7 is a plan view of an ICPS design employing comer ears sized to intersect and form a crossed support surface within the chip accommodating zone;

FIG. 8 is a plan view of an exemplary embodiment showing a single annular sidebar enclosing a circular chip accommodating zone;

FIG. 8A is a plan view of an exemplary embodiment showing four curvilinear sidebars, each having a single centrally located ear, and a centrally connected support member;

FIG. 9 is a plan view of an ICPS lead frame having sidebars of minimal dimension, wherein said sidebars are fully incorporated into said support members.

FIG. 10A is a fragmentary side elevation of the lead frame of FIG. 10; and

DETAILED DESCRIPTION OF THE INVENTION

Figure 3A:
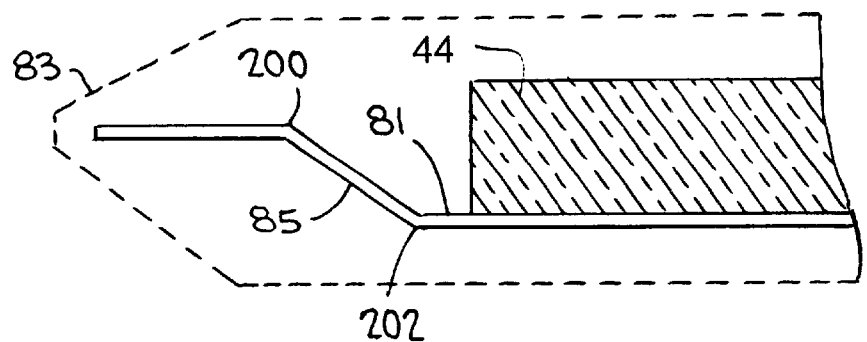
FIG. 3A is a cross section of the ICPS lead frame of FIG. 3, taken along line 3A—3A.
Figure 10:
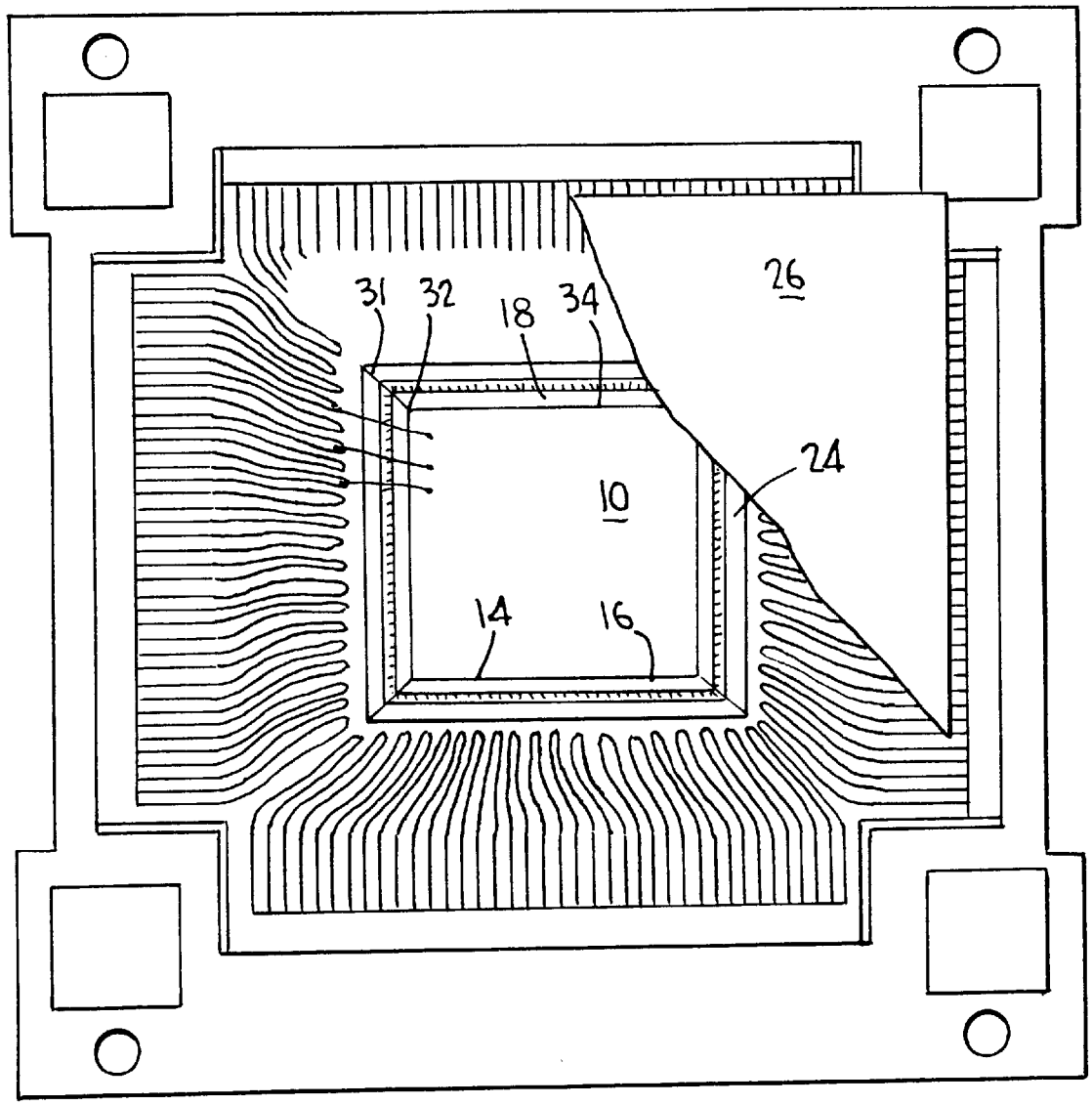
FIG. 10 is a fragmentary plan view of a conventional integrated circuit package employing a conventional full pad lead frame.
Figure 10B:
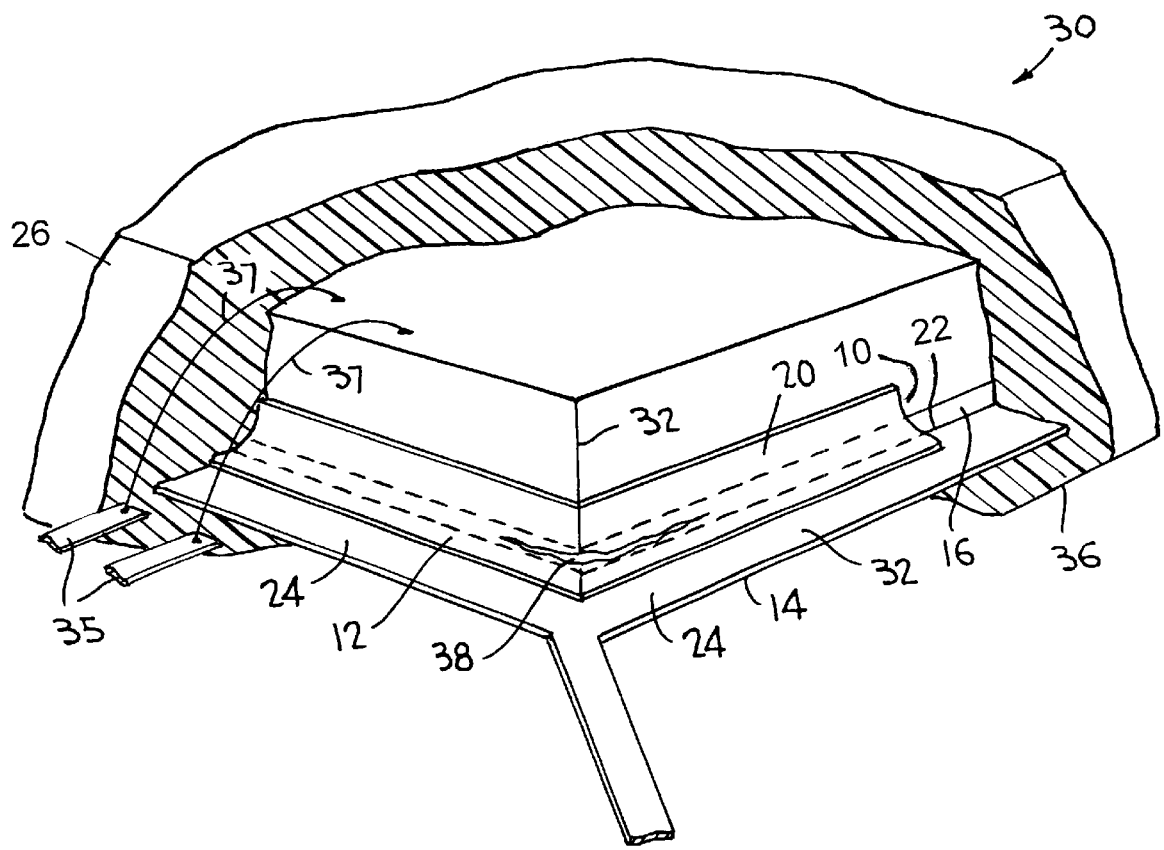
FIG. 10B is a fragmentary perspective view of the lead frame of FIG. 10.

FIGS. 1, 1A, and 1B illustrate an exemplary embodiment of an integrated circuit package 40 incorporating lead frame 42 for an integrated circuit chip or die 44 according to the invention. The chip 44 has a respective top surface 46, a bottom surface 48, sides 50, and side edges 55. The lead frame 42 reduces or eliminates popcorn cracking failures during periods of high temperature processing; for example, during reflow soldering.

The lead frame 42 includes four interconnected coplanar sidebars 45. Each sidebar 45 has opposite ends 56 and respective inner sides 52 and outer sides 53. The inner sides are coincident with the boundaries in space defining a chip accommodating zone 54. The size of the chip accommodating zone 54 is such that the entire chip 44, when positioned in its usual orientation, is entirely within the boundaries, and thus with in the chip accommodating zone 54. In an exemplary embodiment, the normal distance between inner and outer sides is between 8 and 14 mils. In most instances, the entire lead frame 42 is etched or stamped from a thin conductive metal sheet, for example copper sheet. Typically the thickness of the copper sheet is in the range from about 4 mils to about 8 mils. Other materials and thicknesses may be appropriate for various applications. It should be noted that, while the present embodiment includes a plurality of rectilinear sidebars 45, having rectilinear inner sides, other embodiments may incorporate one or more curvilinear sidebars, having curvilinear inner sides, as shown in FIG. 8A, or a single annular sidebar as shown in FIG. 8. Moreover, sidebars of various configurations may be combined to meet the needs of a particular application.

In the present embodiment, the sidebars 45 are joined at the respective ends 56 to define the open chip-accommodating zone 54. In this embodiment, a chip contacting ear 62 extends from the inner side 52 of each sidebar 45. The bottom 48 of the chip 44 engages, in a confronting relation, an upper surface 64 of each ear 62, and is secured theron by a chip attach material 66. The chip 44 is then located in spaced relation with the inner sides 52 of the sidebars 45 as shown. In a known manner leads 69 are connected via wire bonds 71 to the top 46 of the chip 44. Encapsulation material 68 is molded around the frame 42 and chip 44 as shown. The encapsulation material 68 forms a bond with the frame 42 and also bonds to the top 46, bottom 48 and sides 50 of the chip 44. As can be appreciated the encapsulation material 68 is molded through and around the frame 42 to form a firm and robust bond with the bottom 48 of the chip 44 through the zone 54.

Each ear 62 protrudes into the zone 54 and defines intermediate crack-stop regions 70 therebetween, the purpose of which is discussed hereinafter. As noted above, the chip 44 is secured to a portion of the upper surface 64 of the ears 62 by the chip attach material 66. As best shown in FIG. 1, the chip 44 is suspended in the frame 42 with its sides 50 generally parallel to and spaced from the sidebars 45 forming open regions 70, as shown. This allows the encapsulation material 68 to flow around the frame 42 and through the open regions 70 to provide a strong bond.

In addition, die attach fillet is limited to the ears only. The rest of the chip edge 50 does not have die attach fillet and die pad shoulder. This will reduce the delamination problem.

In the present embodiment, each ear 62 has respective length I and width w dimensions. The length I is defined as parallel to the corresponding sidebar 45. The width w is perpendicular to the corresponding sidebar 45, and extends inwardly into the zone 54. In an exemplary embodiment, the values of length I may range from between approximately 40 mils to 80 mils. Independently the values of width w may range from 40 mils to 80 mils. The open crack-stop regions 70 occupy the spaces between the ears 62. The crack-stop regions 70 arrest propagation of delamination and/or cracking between the chip and the ear beyond the bonding area 72, i.e., the area 72 where the upper surface 64 of the ear 62 is attached to the bottom 48 of the chip.

As can be seen in FIG. 1 and FIG. 1A, the bonding area 72 has a limited extent and is surrounded by different materials including the encapsulation material 68, which thus forms materials discontinuities at various boundaries 74 in the package 40 structure. Accordingly, cracks originating at the interface between the chip 44 and the frame 42, tend to stop at the boundary 74 where the materials are discontinuous.

The length I of each ear 62 is generally limited to less than the length of the corresponding sidebar 45. More importantly the length I is generally less than the corresponding length of the chip along the side edge 55 to thereby minimize any fillet 75 which may form near the portion of the side edge 55 of the chip 44 overlying the ear 62.

The width w of the ear 62 should be large enough to insure that the ear extends sufficiently beneath the chip 44 to provide adequate bearing support during encapsulation and to allow adequate bonding area 72 between the chip 44 to the frame 42.

As can be seen in FIG. 1, although the ears provide a relatively small bonding area 72 for the chip 44, this is sufficient to secure the chip 44 in place while it is being encapsulated. Significantly, the lead frame exhibits little shoulder region, and all die attach interfaces are typically remote from chip corners. Consequently little of the interface that is susceptible to delamination, is found in the high stress corner 41 and shoulder regions. The resulting package 40 is robust, ultimately providing relatively high strength bonds between the chip and frame upon encapsulation. The permanent bond formed between the chip 44 and the encapsulation material 68 has a large surface area relative to the chip attach bond. Conversely, the length of the unsupported beam represented by the delaminated area, is limited by the minimal dimensions of the chip attach region. Failure of the chip attach after encapsulation thus does not adversely affect package integrity because the superior strength of the encapsulation material arrests delamination as long as the dimensions of the delaminated region are small enough to cause delamination propagation.

In the present embodiment, the lead frame also includes support members 80 which extend from the corners 82 of the frame 42. The support members serve to support the sidebars 45 within the mold during application and hardening of the mold material. Each support member has a proximal end 81 and a distal end 83. The proximal end 81 is connected to the respective corner 82, and the distal end 83 is remotely supported during encapsulation. The support member of the present embodiment also includes a down-set 85 as shown in FIG. 1, and as further detailed in FIG. 3A. The down-set is implemented as a pair of small radius curves or bends 200, 202, serving to offset the distal end 83 of the support member from the proximal end 81, while maintaining a general parallelism between the portions of the support member in the vicinity of each end respectively.

FIGS. 2 and 3 illustrate ears 84 and 86 of varying sizes. By providing a relatively wide ear 84, as shown in FIG. 2, one creates a lead frame adaptable to the mounting of chips of a variety of different sizes. By providing a relatively narrow ear 86, as shown in FIG. 3, one creates a lead frame that maximizes the surface area of the bottom of the chip exposed and available for bonding to the encapsulation material.

FIG. 3A illustrates a down-set 85 formed in the support member 80 of the lead frame. The down-set serves to correctly position the chip 44 for mounting with respect to the encapsulation material and leads.

FIG. 4 shows an apertured frame 90 having ears 92 located in the comers 94 with intermediate sidebars 96. This embodiment provides support for the corresponding comers 93 of the chip 100. Crack-stop regions 102 are formed, as shown, adjacent to the sidebars 96.

FIG. 5 shows an embodiment where ear 110 is perforated by a through hole 112 having an axis perpendicular to the surface 111 of the ear (into the page of the drawing). The purpose of the hole 112 is to further minimize the surface 111 of the ear 110 directly beneath the lower edge of the chip 114, and provide a locking effect to prevent delamination between the ear surface 111 and the mold compound.

FIG. 6 shows a frame 120 having ears 122 attached to sidebars 124 by an intermediate neck 126. According to the invention, the neck 126 may be formed by one or more undercuts 128. Like the hole 112 in FIG. 5, the undercuts 128 reduce ear area and provide a locking effect.

FIG. 7 shows an apertured frame 130 having ears 132 located in the comers 134 and extending to intersection 135 within the chip accommodating zone. Between the ears are intermediate sidebars 136. This embodiment provides support for the corresponding comers 138 of the chip 140, with additional support across the diagonal of the chip. Crack-stop regions 142 are formed, as shown, adjacent to the sidebars 136.

The embodiment of FIG. 8 shows an IPCS apertured frame having an annular configuration in this configuration, a single annular sidebar 150 encompasses the chip accommodating zone 152. One or more ears 154 are connected to the inner side 156 of the annular sidebar 152, and extend into the chip accommodating zone 152. In this embodiment, the inner diameter of the annulus 150 is such as to exceed the largest dimension of the chip 160, so that the chip 160 fits completely within the chip accommodating zone 152. The annulus 150 has a top surface 158 which, in this embodiment, does not contact the bottom of the chip 160.

In FIG. 8A, an exemplary embodiment is shown having curved sidebars 170. In this embodiment the sidebars 170 are independent, one from the other, having no connecting comers. The result is an opening 172 where the comer might otherwise be. In the embodiment shown, each sidebar 170 includes at least one ear remote from the comer opening 172, and attached to the inner side 176 of the sidebar 170. Support members 178 are similarly attached to a respective sidebar at an outer side 180. The ears 174 each have a top surface 182 that contacts the chip 190 in a confronting relation.

A further embodiment, shown in FIG. 9 shows an ICPS lead frame that provides ears attached to the supporting members via a minimum of intervening sidebar.

It will be appreciated by persons skilled in the art that numerous variations and modifications may be made to the invention as shown in the specific embodiments without departing from the spirit or scope of the invention as broadly described. The present embodiments are therefore considered in all respects illustrative and not restrictive.

We claim:

1. A lead frame for an integrated circuit chip having an outer marginal edge and an attach surface, said lead frame comprising:

one or more sidebars, each of said one or more sidebars having an inner side and an outer side, each said inner side defining a boundary of a chip-accommodating zone, said zone being sized to accommodate the chip entirely therewithin in spaced relation with the outer marginal edge of the chip, and a plurality of ears connected to at least one of said inner sides and protruding into said chip-accommodating zone, each ear having a surface for engaging the attach surface of the chip in confronting relation along a portion of the outer marginal edge of the chip.

2. The lead frame of claim 1, wherein said ear upper surface engages the bottom of the chip at a location remote from the high stress regions associated with the comers of the chip, to minimize the risk of delamination.

3. The lead frame of claim 1, wherein said inner side is generally rectilinear.

4. The lead frame of claim 1, wherein said inner side is generally curvilinear.

5. The lead frame of claim 1, wherein each said ear has at least one length dimension substantially shorter than a corresponding length of the corresponding sidebar.

6. The lead frame of claim 1, further comprising:

one or more support members each having a proximal and a distal end, each support member being connected to at least one sidebar by said respective proximal end.

7. The lead frame of claim 6, wherein said support members further comprise a down-step adapted to correctly position the chip for mounting.

8. The lead frame of claim 6 wherein said sidebars each further comprise: opposite ends, said opposite ends intersecting to define comers.

9. The lead frame of claim 8, wherein each of said connections between each support member and the at least one sidebar is in the vicinity of said respective corner.

10. The lead frame of claim 8, wherein at least one of said ears is located proximate to a respective corner.

11. The lead frame of claim 8, wherein at least one of said ears is located remote from said corners.

12. The lead frame of claim 1, wherein said at least one ear extends to intersect with at least one other ear.

13. The lead frame of claim 1, further comprising:

a plurality of leads, said leads being electrically isolated from said sidebars and disposed outside of said chip-accommodating zone, each of said leads having a proximal end and a distal end, said proximal end being proximate to said one or more sidebars.

14. The lead frame of claim 1, wherein at least one ear has at least one through-hole in the vicinity of the corresponding sidebar.

15. The lead frame of claim 14, wherein said through-hole is generally perpendicular to said top surface.

16. The lead frame of claim 14 wherein said through-hole provides a locking effect.

17. The lead frame of claim 1, wherein each ear includes a contact area within said upper surface, and a neck portion disposed between said inner side of said sidebar and said contact area.

18. The lead frame of claim 17, wherein said neck has at least one length dimension measured in a direction generally parallel to said respective inner side, said neck length dimension being shorter than a corresponding length of said respective ear.

19. The lead frame of claim 18, wherein said length dimension is measured generally rectilinearly.

20. The lead frame of claim 18, wherein said length dimension is measured generally curvilinearly.

21. The lead frame of claim 18, wherein said neck portion performs a locking function.

22. The lead frame of claim 1, wherein said ears define open crack-stop areas in the zone between said ears.

23. The lead frame of claim 1, wherein a chip attach material is disposed between the bottom surface of the chip and said upper surface of said ear.

24. A lead-frame for connecting and supporting an integrated circuit chip, comprising:

sidebars having inwardly extending ears for supporting the chip, and having open crack-stop areas therebetween.

25. An integrated circuit package comprising;

a lead frame, an integrated circuit chip secured to the frame, said chip having an outer marginal edge and a frame-engaging surface, said frame comprising a plurality of sidebars, each having opposite ends, and having an inner side and an outer side, said sidebars defining a chip-accommodating zone, said zone being sized to accommodate the chip entirely within the inner sides of the sidebars in spaced relation therewith, a plurality of ears each being connected to an inner side and protruding into said chip-accommodating zone, each ear having a chip-supporting surface for engaging the frame engaging surface of the chip in confronting relationship therewith along a portion of the outer marginal edge defining a contact area with the frame engaging surface, said ears defining crack-stop areas between the ears and adjacent the sidebars;

a chip attach material disposed between the ears and the chip in the contact area for securing the chip to the frame;

an encapsulation material surrounding the chip and the frame and being bonded thereto.

* * * * *